United States Patent [19]
Thompson et al.

[11] Patent Number: 6,166,489
[45] Date of Patent: Dec. 26, 2000

[54] LIGHT EMITTING DEVICE USING DUAL LIGHT EMITTING STACKS TO ACHIEVE FULL-COLOR EMISSION

[75] Inventors: Mark Thompson, Anaheim, Calif.; Stephen R. Forrest; Gong Gu, both of Princeton, N.J.

[73] Assignees: The Trustees of Princeton University, Princeton, N.J.; The University of Southern California, Los Angeles, Calif.

[21] Appl. No.: 09/153,349

[22] Filed: Sep. 15, 1998

[51] Int. Cl.$^7$ ........................................................ H01J 1/62

[52] U.S. Cl. .......................... 313/506; 313/503; 313/504; 428/690

[58] Field of Search ...................................... 313/506, 504, 313/501, 503, 509, 512, 112; 428/690, 704, 917, 457, 332, 213; 257/40, 88, 10

[56] References Cited

U.S. PATENT DOCUMENTS

| | | | |
|---|---|---|---|
| 4,769,292 | 9/1988 | Tang et al. | 428/690 |
| 4,950,950 | 8/1990 | Perry et al. | 313/504 |
| 5,294,870 | 3/1994 | Tang et al. | 313/504 |
| 5,705,285 | 1/1998 | Shi et al. | 313/504 |
| 5,757,026 | 5/1998 | Forrest et al. | 257/40 |
| 5,874,803 | 2/1999 | Garbuzov et al. | 313/506 |

FOREIGN PATENT DOCUMENTS

WO 96/19792  6/1996  WIPO.

OTHER PUBLICATIONS

S. W. Depp and W. E. Howard, "Flat Panel Displays," *Scientific American* 90 (Mar. 1993).

D. Z. Garbuzov et al., "Photoluminescence Efficiency and Absorption of Aluminum Tris–Quinolate (Alq$_3$) Thin Films," 249 *Chemical Physics Letters* 433 (1996).

C. E. Johnson et al., "Luminescent Iridium (I), Rhodium (I), and Platinum (II) Dithiolate Complexes," 105 *Journal of the American Chemical Society* 1795 (1983).

Hosokawa et al., "Highly efficient blue electroluminescence from a distyrylarylene emitting layer with a new dopant," 67 *Appl. Phys. Lett.* 3853–3855 (Dec. 1995).

Adachi et al., "Blue light–emitting organic electroluminescent devices," 56 *Appl. Phys. Lett.* 799–801 (Feb. 1990).

C. C. Wu et al., "Integrated three–color organic light–emitting devices," 69 *Appl. Phys. Lett.* 3117–3119 (Nov. 1996).

H. Vestweber et al., "Electroluminescence from polymer blends and molecularly doped polymers," 64 *Synthetic Metals* 141–145 (1994).

Burrows et al., "Color Tunable Organic Light Emitting Devices," 69 *Appl. Phys. Lett.* 2959 (Nov. 11, 1996).

D. Z. Garbuzov et al., "Organic films deposited on Si p–n junctions: Accurate measurements of fluorescence internal efficiency, and application to luminescent antireflection coatings," 80 *J. Appl. Phys.* 4644–4648 (Oct. 1996).

P.E. Burrows et al., "Reliability and degradation of organic light emitting devices," 65 *Appl. Phys. Lett.* 2922–2924 (Dec. 1994).

H. A. MacLeod, *Thin Film Optical Filters*, pp. 94–110 (1969).

Johnson et al., "Electroluminescence from Single Layer Molecularly doped polymer films," 67 *Pure & Appl. Chem.*, 175–182 (1995).

*Primary Examiner*—Nimeshkumar D. Patel
*Assistant Examiner*—Joseph Williams
*Attorney, Agent, or Firm*—Kenyon & Kenyon

[57] ABSTRACT

Light emitting devices including at least one pixel comprising a first light emitting stack and a second light emitting stack placed side-by-side. The first and second light emitting stacks each comprise a first OLED and a second OLED over the first OLED. The first light emitting stack further includes a downconversion layer under the first OLED. Together, the first and second stacks are capable of emitting any visible color of light.

20 Claims, 4 Drawing Sheets

LIGHT EMITTING DEVICE USING DUAL LIGHT EMITTING STACKS TO ACHIEVE FULL-COLOR EMISSION

FIELD OF THE INVENTION

The present invention relates to light emitting devices, and more particularly, to light emitting devices capable of full-color emission.

BACKGROUND OF THE INVENTION

Organic light emitting devices (OLEDs), which make use of thin film materials that emit light when excited by electric current, are becoming an increasingly popular form of flat panel display technology. There are presently three predominant types of OLED construction: the "double heterostructure" (DH) OLED, the "single heterostructure" (SH) OLED, and the single layer polymer OLED. In the DH OLED, as shown in FIG. 1A, a transparent substrate 10 is coated by an anode layer 11. A thin (100–500 Å) organic hole transporting layer (HTL) 12 is deposited on the anode 11. Deposited on the surface of the HTL 12 is a thin (typically, 50 Å–500 Å) emission layer (EL) 13. The EL 13 provides the recombination site for electrons injected from a 100–500 Å thick electron transporting layer 14 (ETL) with holes from the HTL 12. Examples of prior art ETL, EL and HTL materials are disclosed in U.S. Pat. No. 5,294,870, the disclosure of which is incorporated herein by reference.

The device shown in FIG. 1A is completed by the deposition of metal contacts 15, 16 and a top electrode 17. Contacts 15 and 16 are typically fabricated from indium or Ti/Pt/Au. The electrode 17 is often a dual layer structure consisting of an alloy such as Mg/Ag 17' directly contacting the organic ETL 14, and an opaque, high work function metal layer 17" such as gold (Au) or silver (Ag) on the Mg/Ag. When proper bias voltage is applied between the top electrode 17 and the contacts 15 and 16, light emission occurs from the emission layer 13 through the substrate 10.

The SH OLED, as shown in FIG. 1B, makes use of multifunctional layer 13' to serve as both EL and ETL. One limitation of the device of FIG. 1B is that the multifunctional layer 13' must have good electron transport capability. Otherwise, separate EL and ETL layers should be included as shown for the device of FIG. 1A.

A single layer polymer OLED is shown in FIG. 1C. As shown, this device includes a glass substrate 1 coated by an anode layer 3. A thin organic layer 5 of spin-coated polymer, for example, is formed over the anode layer 3, and provides all of the functions of the HTL, ETL, and EL layers of the previously described devices. A metal electrode layer 6 is formed over organic layer 5. The metal is typically Mg or other conventionally-used low work function metal.

"Full-color emission" can be achieved by devices such as the stacked device shown in FIG. 1D. The device in FIG. 1D includes blue, green and red OLED devices (20, 30, and 40, respectively) for the emission of blue, green and red light, and any combination thereof. It is often difficult to manufacture devices such as that shown in FIG. 1D because the deposition of multiple electrodes (50 and 60) within the stack is often problematic from a processing standpoint and often results in damage to the surrounding organic layers.

To avoid the potential problems associated with multiple electrodes within OLED stacks, full-color emission has been achieved by placing multiple, single-OLED stacks in a side-by-side configuration within a single pixel as shown in FIG. 1E. In the example shown in FIG. 1E, blue, green and red OLEDs 71, 72 and 73 are placed side-by-side on a common substrate 10 and make use of a common electrode 75. Although this configuration minimizes the use of electrodes, the space required for multiple stacks along the substrate 10 results in a degradation in display resolution.

SUMMARY OF THE INVENTION

The present invention includes light emitting devices that include a pixel comprising a first light emitting stack and a second light emitting stack placed side-by-side. The first and second light emitting stacks each comprise a first OLED and a second OLED over the first OLED. The first light emitting stack further includes a downconversion layer under the first OLED. Together, the first and second stacks are capable of emitting any visible color of light.

In one embodiment, the first OLED emits substantially blue light, the second OLED emits substantially red light, and the downconversion layer is a green downconversion layer. As such, the first light emitting stack is capable of emitting red and green light, and combinations thereof, whereas the second light emitting stack is capable of emitting red and blue light, and combinations thereof.

In another embodiment, the first OLED emits substantially blue light, the second OLED emits substantially green light, and the downconversion layer is a red downconversion layer. As such, the first light emitting stack is capable of emitting red and green light, and combinations thereof, whereas the second light emitting stack is capable of emitting red and blue light, and combinations thereof.

One advantage of the present invention is that it minimizes the number of electrodes necessary for the operation of a full-color organic display device.

Another advantage of the present invention is that it provides full-color light emitting devices of high resolution.

Yet another advantage of the present invention is that it provides a simple method for the production of full-color light emitting devices.

DETAILED DESCRIPTION

The present invention provides full-color emission devices while minimizing the number of electrodes in a stack OLED configuration. As such, the present invention minimizes the processing difficulties associated with the deposition of electrodes within OLED stacks. Moreover, the devices of the present invention provide full-color emission from a dual-stack OLED arrangement, thus minimizing the degradation in display resolution that is associated with multi-stack display devices.

Figure 1A:
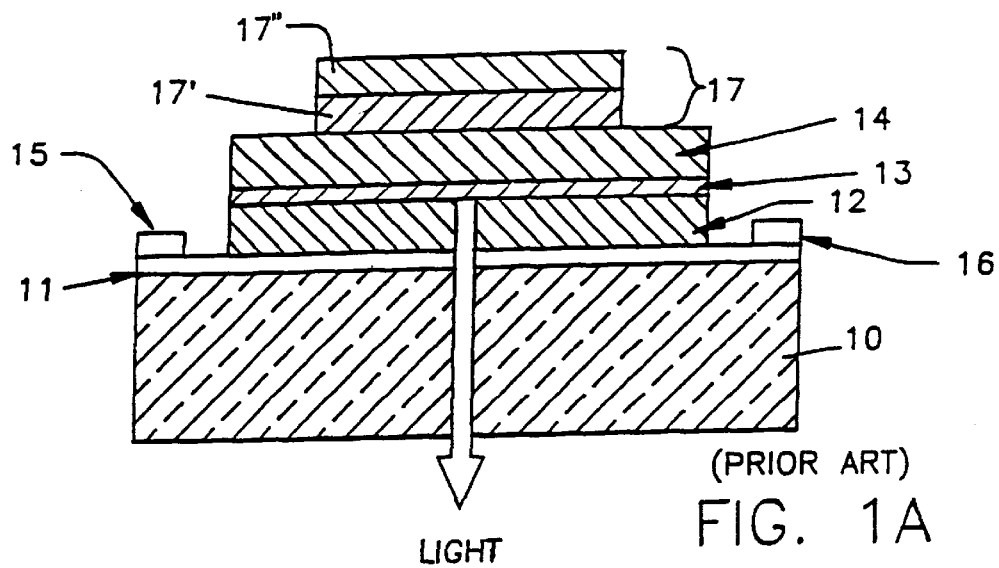
FIG. 1A is a cross-sectional view of a typical organic double heterostructure light emitting device according to the prior art.
Figure 1B:
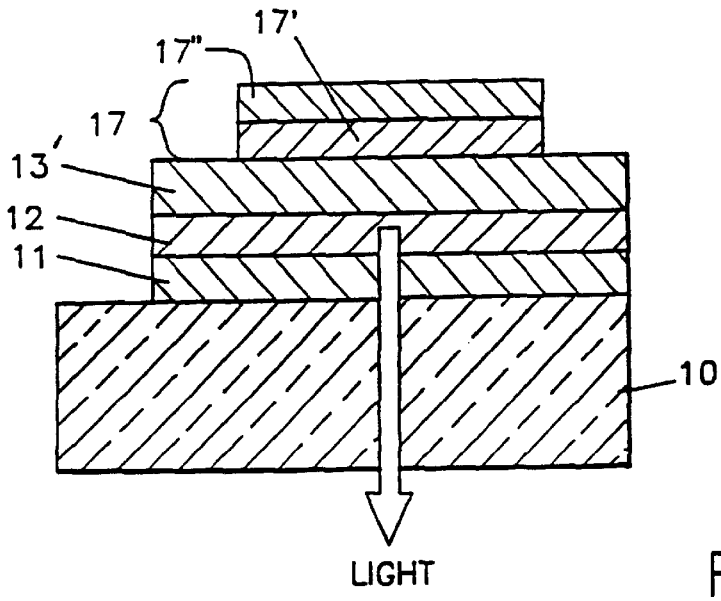
FIG. 1B is a cross-sectional view of a typical organic single heterostructure light emitting device according to the prior art.
Figure 1C:
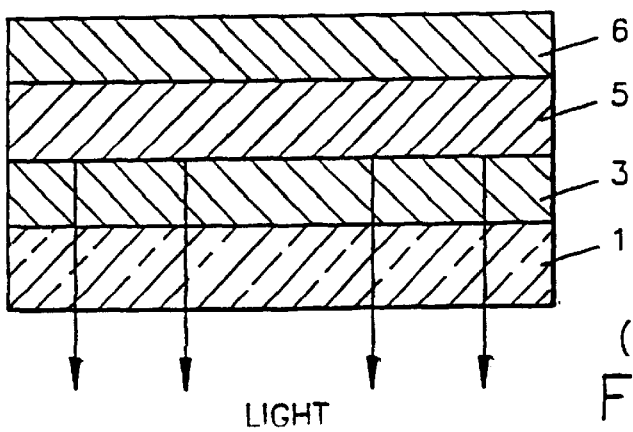
FIG. 1C is a cross-sectional view of a known single layer polymer light emitting device structure according to the prior art.
Figure 1D:
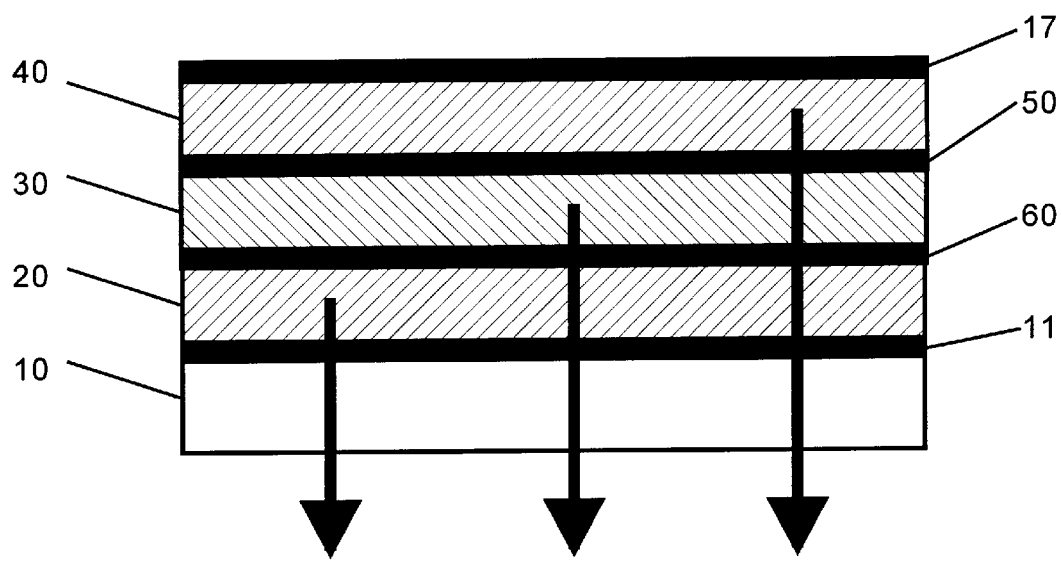
FIG. 1D is a cross-sectional view of a multicolor organic light emitting device.
Figure 1E:
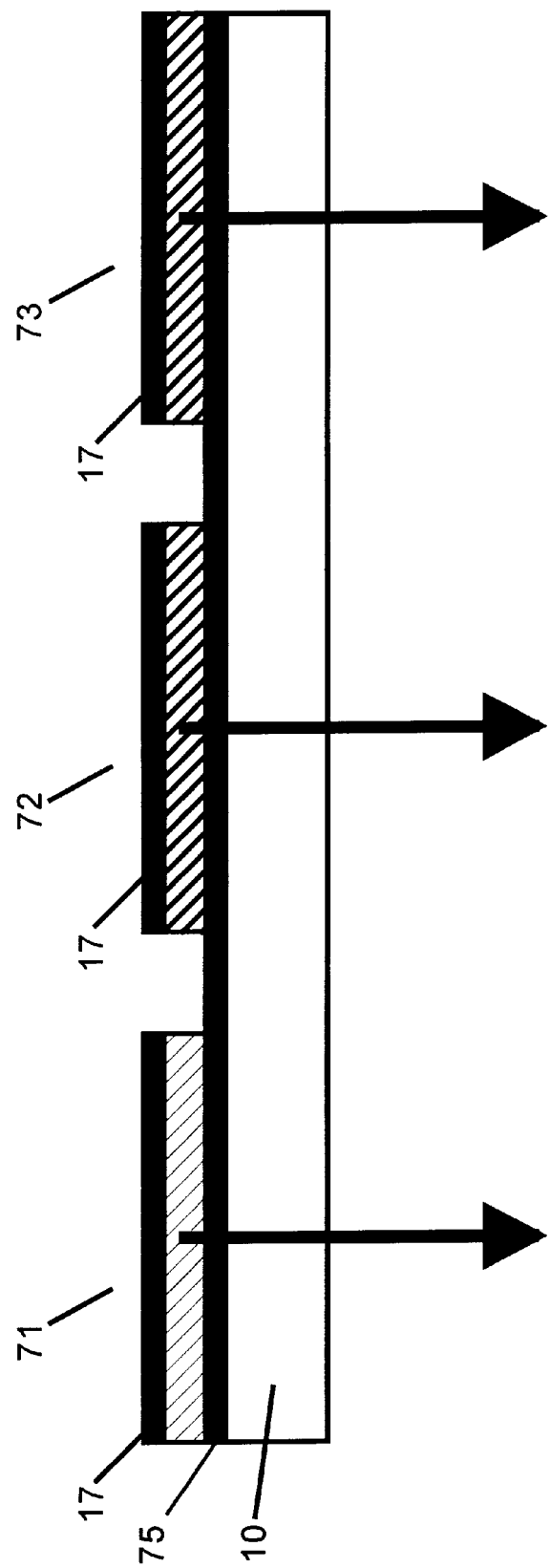
FIG. 1E is a cross-sectional view of a multi-stack organic light emitting device.
Figure 2:
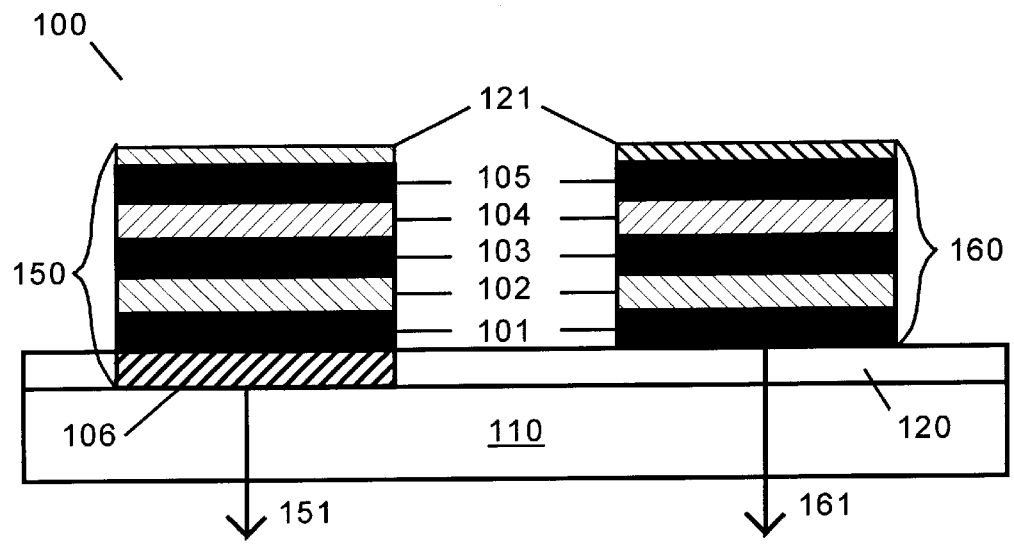
FIG. 2 is a cross-sectional view of a first embodiment of the present invention.

A pixel of an embodiment of the present invention is shown in FIG. 2. Each pixel of a light emitting device 100 comprises a first light emitting stack 150 and a second light emitting stack 160 placed side-by-side. The first and second light emitting stacks each comprise a first electrode 101; a first OLED 102 over the first electrode 101; a second electrode 103 over the first OLED 102; a second OLED 104 over the second electrode 103; and a third electrode 105 over the second OLED 104. The first light emitting stack 150 includes a downconversion layer 106 under the first electrode 101.

In each of the first light emitting stacks 150, the emission of the OLEDs 102, 104 preferably substantially overlaps the absorption of the downconversion layer such that the wavelength of light emitted by one or both of the OLEDs 102, 104 is less than that emitted by the downconversion layer 106. For example, in one embodiment, the first OLED 102 emits blue light, the second OLED 104 emits red light, and the downconversion layer 106 is green. In this embodiment, the blue OLED 102 "pumps" the green downconversion layer 106. The first light emitting stack 150 is therefore capable of emitting red and/or green light 151, and the second light emitting stack 160 is capable of emitting red and/or blue light 161. Together, the first stack 150 and the second stack 160 are capable of emitting any visible color of light.

In a second embodiment, the first OLED 102 emits blue light, the second OLED 104 emits green light, and the downconversion layer 106 is red. In this embodiment, the blue OLED 102, and preferably the green OLED 104, pump the red downconversion layer 106. As such, the first light emitting stack 150 is capable of emitting red light 151, and the second light emitting stack 160 is capable of emitting green and/or blue light 161. Depending on the material used in the downconversion layer 106, green light emitted from the green OLED 104 may also pass through the red downconversion layer 106 and be emitted by the first light emitting stack 150. Together, the first stack 150 and the second stack 160 are capable of emitting any visible color of light.

The light emitting device 100 is preferably placed on a substantially transparent substrate 110 such as glass, quartz, sapphire or plastic. The substrate 110 is, for example, rigid, flexible, and/or shaped to a desired configuration. As shown in FIG. 2, the light emitted from first and second light emitting stacks 150, 160 passes through the substrate 110.

For simplicity, the light emitting layers 102 and 104 are shown as single layers in the drawings. As is well-known in the art, however, these layers actually comprise multiple sublayers (e.g., HTL's, EL's and ETL's) when they are not single-layer polymer devices. The arrangement of the sublayers obviously depends on whether the device is of DH or SH configuration.

It is to be appreciated that the present invention includes embodiments in which one of the two light emitting stacks includes only one OLED where the other light emitting stack is capable of emitting multiple colors. In such embodiments, the light emitting stack with only one OLED emits the necessary color to complete a set of primary colors that are together emitted from both stacks. Embodiments with two OLEDs in each stack, however, are generally preferred because, with the exception of the downconversion layer 106, identical layers are deposited together in the same sequence for both of the light emitting stacks, with no further processing being necessary. In contrast, processing complexity is increased by preventing the deposition of OLED layers on a set of light emitting stacks or by removing OLED layers that have already been deposited.

The electrodes 101 and 103 comprise a substantially transparent, conductive material such as indium-tin-oxide ("ITO"). Where a transparent, conductive layer serves as both cathode for one light emitting layer and anode for another, such as layer 103, or solely as a cathode, such as layer 105, it preferably comprises a compound electrode such as a semi-transparent low work function metal and ITO. An anode layer that does not also serve as a cathode, however, is preferably ITO. A metal contact layer 121 is optionally placed over the third electrode 105 of both the first and second light emitting stacks 150, 160 to serve both as a conductor for driving the stacks and as a reflector for reflecting the light emitted from OLED layers 102, 104 towards the substrate 110. When used, the metal contact layer 121 comprises any suitable material, such as magnesium, lithium, aluminum, silver, gold and alloys thereof.

Blue light emitting layers 102 used in any embodiment of the present invention are made from any suitable light emissive organic compounds such as, for example, trivalent metal quinolate complexes, Schiff base divalent metal complexes, metal acetylacetonate complexes, metal bidentate ligand complexes, bisphosphonates, metal maleonitriledithiolate complexes, molecular charge transfer complexes, aromatic and heterocyclic polymers and rare earth mixed chelates.

The metal bidentate complexes which may be used for layer 102 have the formula $MDL^4_2$ wherein M is selected from trivalent metals of Groups 3–13 of the Periodic Table and Lanthanides. The preferred metal ions are $Al^{+3}$, $Ga^{+3}$, $In^{+3}$ and $Sc^{+3}$. D is a bidentate ligand such as 2-picolylketones, 2-quinaldylkentones and 2-(o-phenoxy) pyridine ketones. The preferred groups for $L^4$ include acetylacetonate, compounds of the formula $OR^3R$ wherein $R^3$ is selected from Si and C, and R is selected from hydrogen, substituted and unsubstituted alkyl, aryl and heterocyclic groups; 3,5-di(t-bu) phenol; 2,6-di(t-bu) phenol; 2,6-di(t-bu) cresol; and $H_2Bpz_2$. By way of example, the wavelength resulting from measurement of photoluminescence in the solid state of aluminum (picolymethylketone) bis [2,6-di(t-bu) phenoxide] is 420 nm. The cresol derivative of this compound also measured 420 nm. Aluminum (picolylmethyl-ketone) bis ($OsiPh_3$) and scandium (4-methoxy-picolyl-methylketone) bis (acetylacetonate) each measured 433 nm, while aluminum [2-(O-phenoxy) pyridine] bis [2,6-di(t-bu) phenoxide] measured 450 nm.

Red light emitting layers 104 used in any embodiment of the present invention are made from any suitable light emissive organic compounds such as, for example, divalent metal maleonitriledithiolate ("mnt") complexes, such as those described by C. E. Johnson et al. in "Luminescent Iridium(I), Rhodium(I), and Platinum(II) Dithiolate Complexes," 105 *Journal of the American Chemical Society* 1795 (1983). For example, the mnt [Pt $(Pph_3)_2$] has a characteristic wavelength emission of 652 nm.

Additional OLED materials are known in the art (see, e.g., U.S. Pat. No. 5,757,026 to Forrest et al., entitled "Multicolor Organic Light Emitting Devices"; U.S. Pat. No. 5,294,870 to Tang et al., entitled "Organic Electroluminescent Multicolor Image Display Device"; Hosokawa et al., "Highly efficient blue electroluminescence from a distyrylarylene emitting layer with a new dopant," 67 *Applied Physics Letters*

3853–55 (December 1995); Adachi et al., "Blue light-emitting organic electroluminescent devices," 56 *Applied Physics Letters* 799–801 (February 1990); and Burrows et al., "Color-Tunable Organic Light Emitting Devices," 69 *Applied Physics Letters* 2959–61 (November 1996)). The entire disclosures of these references are incorporated herein by reference. Distyrylarylene derivatives such as those described in Hosokawa et al. are a preferred class of compounds.

The downconversion of light emitted by the first and second OLEDs 102, 104 by downconversion layer 106 is by phosphorescence or fluorescence. The green and red downconversion media used in the layers 106, for example, are well-known in the art. U.S. Pat. Nos. 4,769,292 and 5,294,870, the disclosures of which are hereby incorporated by reference, are illustrative. These phosphor dyes are, for example, vacuum deposited in a solid polymer matrix or dissolved in matrix polymer such as polymethylmethacrylate. Examples of green fluorescent dyes are polymethine dyes including cyanines, merocyanines, complex cyanines and merocyanines, oxonols, hemioxonols, styryls, merostyryls and streptocyanines. Examples of red fluorescent dyes are 4-dicyano-methylene-4H-pyrans and 4-dicyanomethylene-4H-thiopyrans.

The deposition techniques for any of the above-listed methods are well-known in the art. For example, the preferred method of depositing the OLED layers is by thermal evaporation (or spin coating if a polymer LED is used); the preferred method of depositing metal layers is by thermal or electron-beam evaporation; the preferred method of depositing ITO is by electron-beam evaporation or sputtering; and the preferred methods of depositing phosphor layers is by sputtering, vacuum deposition, spin coating or ink jet printing.

Figure 3:
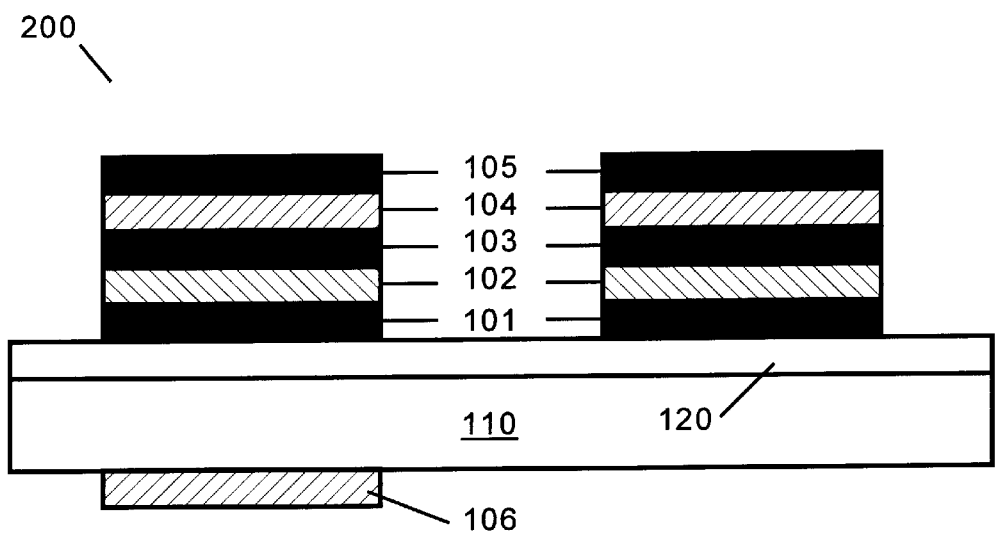
FIG. 3 is a cross-sectional view of a second embodiment of the present invention.

An alternative structural arrangement of any embodiment of the present invention is shown in FIG. 3. In this embodiment, the downconversion layer 106 is placed under the substrate 110 rather than directly under the electrode 101. The embodiment shown in FIG. 3 is generally preferred over the embodiment shown in FIG. 2 because the processing complexity is reduced by the ability to deposit the layer 106 separately from the other layers of the stack 150, and further, because the configuration shown in FIG. 3 may result in a decrease in waveguiding losses as compared with that of FIG. 2.

The devices of the present invention preferably include a planarization layer, shown as layer 120 in FIGS. 2 and 3. The purpose of the planarization layer is to ensure that stacks 150 and 160 are deposited on a flat, planar surface. The planarization layer 120 as shown in FIG. 2 is formed, for example, by depositing green downconversion layer 106 onto the substrate 110, then spin-coating a layer of polyimide as the planarization layer 120, and then polishing the planarization layer 120 to a flat surface. The polyimide layer 120 may be completely polished away from the region over the green downconversion layer 106 as shown in FIG. 2, or alternatively, the planarization layer 120 may extend over the green downconversion layer 106.

The present invention is used to provide efficient, high brightness, monochromatic or multicolor, flat panel displays of any size. The images created on such displays could be text or illustrations in full-color, in any resolution depending on the size of the individual LED's. Display devices of the present invention are therefore appropriate for a wide variety of applications including billboards and signs, computer monitors, and telecommunications devices such as telephones, televisions, large area wall screens, theater screens and stadium screens. The displays of the present invention may comprise a single pixel as herein described, or a plurality of such pixels.

The present invention provides multicolor light emitting devices that are made by simple methods and possess high resolution. Those with skill in the art may recognize various modifications to the embodiments of the invention described and illustrated herein. Such modifications are meant to be covered by the spirit and scope of the appended claims.

We claim:

1. A light emitting device that includes a pixel comprising:
   a first light emitting stack and a second light emitting stack; wherein
   said first and second light emitting stacks are placed side-by-side;
   said first and second light emitting stacks each comprise a first OLED and a second OLED over said first OLED;
   said first light emitting stack includes a downconversion layer under said first OLED; and
   together, said first and second light emitting stacks are capable of emitting any visible color of light.

2. The device of claim 1, wherein a wavelength of light emitted by at least one of said first and second OLEDs is less than a wavelength of light emitted by said downconversion layer.

3. The device of claim 1, wherein said first OLED emits substantially blue light.

4. The device of claim 3, wherein said second OLED emits substantially red light.

5. The device of claim 4, wherein said downconversion layer is a green downconversion layer.

6. The device of claim 3, wherein said second OLED emits substantially green light.

7. The device of claim 6, wherein said downconversion layer is a red downconversion layer.

8. The device of claim 1, further comprising a substrate under said first and second light emitting stacks.

9. The device of claim 8, wherein said downconversion layer is located between said substrate and said first OLED of each of said first light emitting stacks.

10. The device of claim 8, wherein said downconversion layer is located under said substrate.

11. The device of claim 8, wherein said substrate is glass.

12. The device of claim 8, further comprising a planarization layer between said substrate and said first and second light emitting stacks.

13. The device of claim 12, wherein said planarization layer comprises polyimide.

14. The device of claim 8, further comprising
   a first electrode between said substrate and said first OLED;
   a second electrode between said first and second OLEDs; and
   a third electrode over said second OLED.

15. The device of claim 14, wherein at least one of said first and second electrodes comprises indium tin oxide.

16. The device of claim 14, wherein said third electrode comprises a metal selected from the group consisting of aluminum, silver, gold, and alloys thereof.

17. An electronic device incorporating the device of claim 1, said electronic device selected from the group consisting of a computer; a television; a large area wall, theater or stadium screen; a billboard; a sign; a vehicle; a printer; a telecommunication device; and a telephone.

18. A pixel for use in a light emitting device, said pixel comprising:
- a first light emitting stack and a second light emitting stack; wherein
- said first and second light emitting stacks are placed side-by-side in each of said pixels;
- each of said first and second light emitting stacks comprises a first OLED and a second OLED over said first OLED;
- each of said first light emitting stacks includes a downconversion layer under said first OLED; and
- together, said first and second light emitting stacks are capable of emitting any visible color of light.

19. A light emitting device comprising:
- a first light emitting stack and a second light emitting stack; wherein
- said first and second light emitting stacks are placed side-by-side;
- said first and second light emitting stacks each comprise a first OLED and a second OLED over said first OLED;
- said first light emitting stack includes a downconversion layer under said first OLED; and
- together, said first and second light emitting stacks are capable of emitting any visible color of light.

20. The device of claim 19, wherein a wavelength of light emitted by at least one of said first and second OLEDs is less than a wavelength of light emitted by said downconversion layer.

* * * * *